United States Patent [19]
Maruhashi et al.

[11] Patent Number: 5,466,955
[45] Date of Patent: Nov. 14, 1995

[54] FIELD EFFECT TRANSISTOR HAVING AN IMPROVED TRANSISTOR CHARACTERISTIC

[75] Inventors: Kenichi Maruhashi; Kazuhiko Onda; Masaaki Kuzuhara, all of Tokyo, Japan

[73] Assignee: NEC Corporation, Japan

[21] Appl. No.: 380,251

[22] Filed: Jan. 30, 1995

Related U.S. Application Data

[63] Continuation of Ser. No. 167,407, Dec. 14, 1993, abandoned.

[30] Foreign Application Priority Data

Dec. 17, 1992 [JP] Japan .................................. 4-337287

[51] Int. Cl.⁶ .................................................. H01L 27/02
[52] U.S. Cl. ........................ 257/192; 257/194; 257/607; 257/615; 257/745
[58] Field of Search .................................. 257/192, 194, 257/201, 615, 607, 609, 744, 745, 280

[56] References Cited

U.S. PATENT DOCUMENTS 4,852,111  7/1989  Hayakawa et al. ..................... 372/45

OTHER PUBLICATIONS

IEEE Electron Device Letters, vol, EDL–6, No. 12, Dec. 1985, "High Transconductance InGaAs/AlGaAs Pseudomorphic Modulation–Doped Field–Effect Transistors", A. Ketterson, et al.

Appl. Phys. Lett. 57 (26), 24 Dec. 1990, "Theoretical gain in strained InGaAs/AlGaAs quantum wells including valence–band mixing effects", S. W. Corzine, et al.

*Primary Examiner*—Mark Prenty
*Attorney, Agent, or Firm*—Laff, Whitesel, Conte & Saret, Ltd.

[57] ABSTRACT

A field effect transistor (20) comprises a first semiconductor layer (24) and a second semiconductor layer (25) formed on the first semiconductor layer. The first semiconductor layer is an undoped layer and is composed of InGaAs. The second semiconductor layer is composed of InAlGaP and is a doped layer in which an n-type impurity is doped. A heterojunction structure is formed between the first semiconductor layer and the second semiconductor layer.

25 Claims, 2 Drawing Sheets

FIELD EFFECT TRANSISTOR HAVING AN IMPROVED TRANSISTOR CHARACTERISTIC

This application is a continuation of application Ser. No. 08/167,407, filed Dec. 14, 1993, now abandoned.

BACKGROUND OF THE INVENTION

This invention relates to a field effect transistor comprising a heterojunction structure for use in generating a two dimensional electron gas which is used as a carrier.

A field effect transistor of the type described, comprises a first semiconductor layer and a second semiconductor layer formed on the first semiconductor layer. A heterojunction structure is formed between the first semiconductor layer and the second semiconductor layer. Such a field effect transistor may be called a high electron mobility transistor.

In order to improve a transistor characteristic of the field effect transistor, it is necessary to make a conduction-band discontinuity be high between the first semiconductor layer and the second semiconductor layer.

A conventional field effect transistor of the above-mentioned type is disclosed in a title of "High Transconductance InGaAs/AlGaAs Pseudomorphic Modulation-Doped Field-Effect Transistors" contributed by A. Ketterson et al to IEEE ELECTRON DEVICE LETTERS, Vol. EDL-6, December 1985, pages 628 to 630.

In the conventional field effect transistor, an undoped InGaAs semiconductor layer is used as the first semiconductor layer. An n-type AlGaAs semiconductor layer is used as the second semiconductor layer. According to a report contributed by S. W. Corzine et al to APPLIED PHYSICS LETTERS, Vol. 57, No. 26, 1990, pages 2835–2837, it is known that the conventional field effect transistor has the conduction-band discontinuity of 0.28 eV when the undoped InGaAs semiconductor layer is composed of $In_{0.2}Ga_{0.8}As$ and the n-type AlGaAs semiconductor layer is composed of $Al_{0.2}Ga_{0.8}As$.

However, it is difficult to obtain a high transistor characteristic in the conventional field effect transistor inasmuch as the conventional field effect transistor does not have enough of the conduction-band discontinuity between the first semiconductor layer and the second semiconductor layer.

SUMMARY OF THE INVENTION

It is therefore an object of this invention to provide a field effect transistor capable of improving a transistor characteristic.

Other objects of this invention will become clear as the description proceeds.

On describing the gist of this invention, it is possible to understand that a field effect transistor comprises a first semiconductor layer, a second semiconductor layer formed on the first semiconductor layer, and a heterojunction structure formed between the first layer and the second layer.

According to this invention, the first semiconductor layer is composed of InGaAs and the second semiconductor layer is composed of InAlGaP.

DESCRIPTION OF THE PREFERRED EMBODIMENTS

Figure 1:
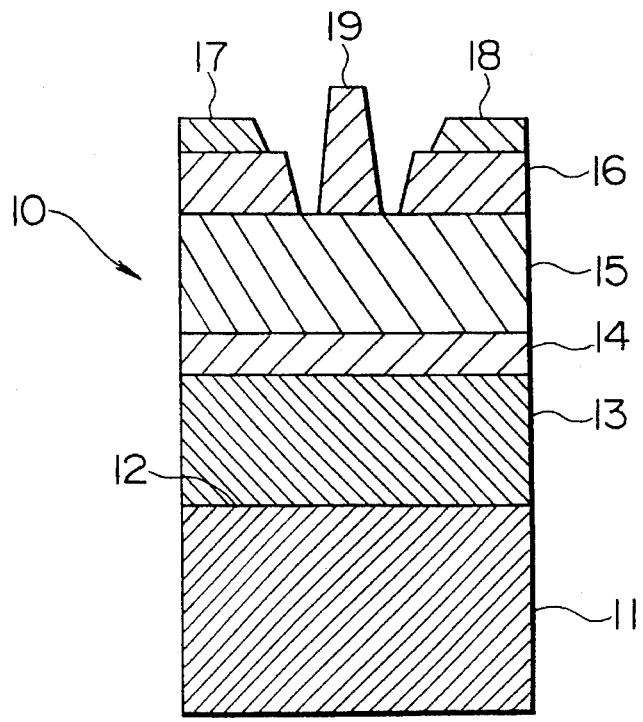
FIG. 1 shows a side view in section of a conventional field effect transistor.

Referring to FIG. 1, description will first be made as regards a conventional field effect transistor 10 for a better understanding of this invention. The field effect transistor 10 comprises a semi-insulating GaAs substrate 11 which has a principal surface 12 directed upwards in FIG. 1, an undoped GaAs layer 13 on the principal surface, an undoped InGaAs layer 14 on the undoped GaAs layer 13, an n-type AlGaAs layer 15 on the undoped InGaAs layer 14, an n-type GaAs layer 16 on the n-type AlGaAs layer 15, first and second ohmic electrodes 17 and 18 on the n-type GaAs layer 16, and a gate electrode 19 on the n-type AlGaAs layer 15. In the illustrated example, the undoped InGaAs layer 14 is used as a first semiconductor layer. The n-type AlGaAs layer 15 is used as a second semiconductor layer. A heterojunction structure is formed between the undoped InGaAs layer 14 and the n-type AlGaAs layer 15.

The undoped GaAs layer 13 has a thickness of 200 nanometers. The undoped InGaAs layer 14 has a thickness of 15 nanometers. The n-type AlGaAs layer 15 has a thickness of 30 nanometers. The n-type GaAs layer 16 has a thickness of 60 nanometers. Each of the first and the second ohmic electrodes 17 and 18 is composed of AuGe and Ni. The gate electrode 19 is composed of Ti, Pt, and Au.

As well known in the art, a two dimensional electron gas is generated in the heterojunction structure. A channel is formed in the undoped InGaAs layer. Electrons move in the channel.

However, it is difficult to obtain a high transistor characteristic in the field effect transistor 10 when the field effect transistor has the undoped InGaAs layer 14 and the n-type AlGaAs layer 15.

Figure 2:
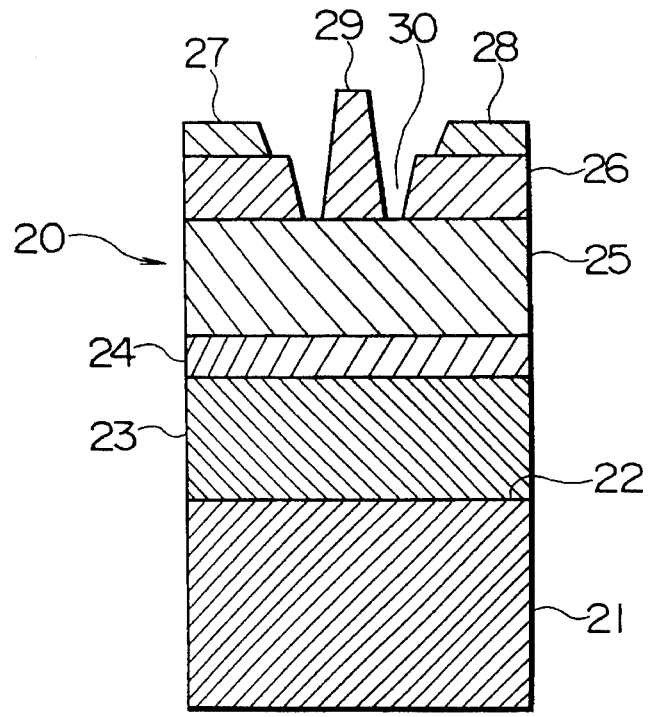
FIG. 2 shows a side view in section of a field effect transistor according to a first embodiment of this invention.

Referring to FIG. 2, description will proceed to a field effect transistor 20 according to a first embodiment of this invention. The illustrated field effect transistor 20 comprises a semi-insulating substrate 21 which has a principal surface 22 directed upwards in FIG. 2, an undoped or buffer layer 23 on the principal surface 22, a first semiconductor layer 24 on the undoped layer 23, a second semiconductor layer 25 on the first semiconductor layer 24, a third semiconductor layer 26 on the second semiconductor layer 25, first and second ohmic electrodes 27 and 28 on the third semiconductor layer 26, and a gate electrode 29 on the second semiconductor layer 25. The heterojunction structure is formed between the first semiconductor layer 24 and the second semiconductor layer 25.

In the example being illustrated, the semi-insulating substrate 21 is composed of GaAs. The undoped layer 23 has a thickness of 200 nanometers and is composed of GaAs. The first semiconductor layer 24 has a thickness of 15 nanometers and is an undoped layer which is composed of $In_{0.2}Ga_{0.8}As$. The first semiconductor layer 24 is used as a channel layer. Therefore, the first semiconductor layer 24 may be called the channel layer.

The second semiconductor layer 25 has a thickness of 30 nanometers and is a doped layer which is composed of $In_{0.5}(Al_{0.3}Ga_{0.7})_{0.5}P$. The second semiconductor layer 25 includes silicon as an n-type impurity which is uniformly doped at a density of $2\times10^{18}$ cm$^{-3}$ in the second semiconductor layer 25. The second semiconductor 25 may be called an electron supplying layer.

The third semiconductor layer 26 has a thickness of 60 nanometers and is a doped layer which is composed of GaAs. The third semiconductor layer 26 includes silicon as the n-type impurity which is uniformly doped at a density of $2\times10^{18}$ cm$^{-3}$ in the third semiconductor layer 26. The third semiconductor layer 26 may be called a cap layer.

On manufacturing the field effect transistor 20 illustrated in FIG. 2, use is made of metal organic chemical vapor deposition on growing the undoped layer 23 and the first through the third semiconductor layers 24 to 26. A central part of the third semiconductor layer 26 is taken away from the second semiconductor layer 25 by etching so that a central part of the second semiconductor layer 25 is exposed. As a result, a recess portion 30 is formed by a remaining part of the third semiconductor layer 26 and the layer surface of the second semiconductor layer 25.

On forming the first and the second ohmic electrodes 27 and 28 on the surface of the remaining part of the third semiconductor layer 26, AuGe and Ni are deposited on the surface of the remaining part of the third semiconductor layer 26 at a deposition process. The deposition process is followed by a heat treatment process so that the first and the second ohmic electrodes 27 and 28 are formed on the surface of the remaining part of the third semiconductor layer 26. One of the first and the second ohmic electrodes 27 and 28 is used as a source electrode. Another one of the first and the second ohmic electrodes 27 and 28 is used as a drain electrode.

By using Ti, Pt, and Au, the gate electrode 29 is formed as Schottky electrode on the layer surface of the second semiconductor layer 25 in the recess portion 30. The gate electrode has a gate length of 0.5 μm.

In the field effect transistor 20, the conduction-band discontinuity is measured between the first semiconductor layer 24 and the second semiconductor layer 25. As a result, it is found that the conduction-band discontinuity is 0.41 eV between the first semiconductor layer 24 and the second semiconductor layer 25.

Figure 3:
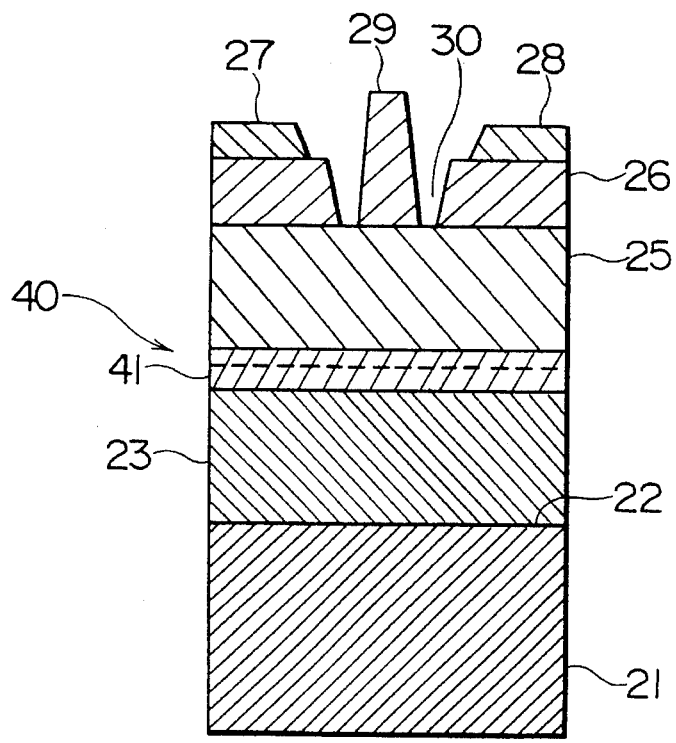
FIG. 3 shows a side view in section of a field effect transistor according to a second embodiment of this invention.

Referring to FIG. 3, description will proceed to a field effect transistor according to a second embodiment of this invention. The illustrated field effect transistor is different in structure from the field effect transistor 20 illustrated in FIG. 2 and is therefore designated afresh by a reference numeral 40. The field effect transistor 40 comprises similar parts which are designated by like reference numerals. In a similar manner as described in the first embodiment, the field effect transistor 40 is manufactured except that the field effect transistor 40 has the first semiconductor layer different from the field effect transistor 20. In the illustrated example, the first semiconductor layer of the field effect transistor 40 will be called a first doped semiconductor layer and will be designated by a reference numeral 41.

The first doped semiconductor layer 41 has a thickness of 15 nanometers and has an upper surface and a lower surface directed upwards and downwards in FIG. 3, respectively. Silicon is doped at a surface density of $5\times10^{12}$ cm$^{-2}$ as the n-type impurity in the first doped semiconductor layer 41 in parallel to the lower surface of the first doped semiconductor layer 41 as shown by a broken line in FIG. 3. The broken line is positioned on a height of 10 nanometers from the lower surface of the first doped semiconductor layer. Namely, silicon is planar doped in the first doped semiconductor layer 41. As a result, the first doped semiconductor layer 41 comprises an undoped film and a doped film inserted into the undoped film.

Figure 4:
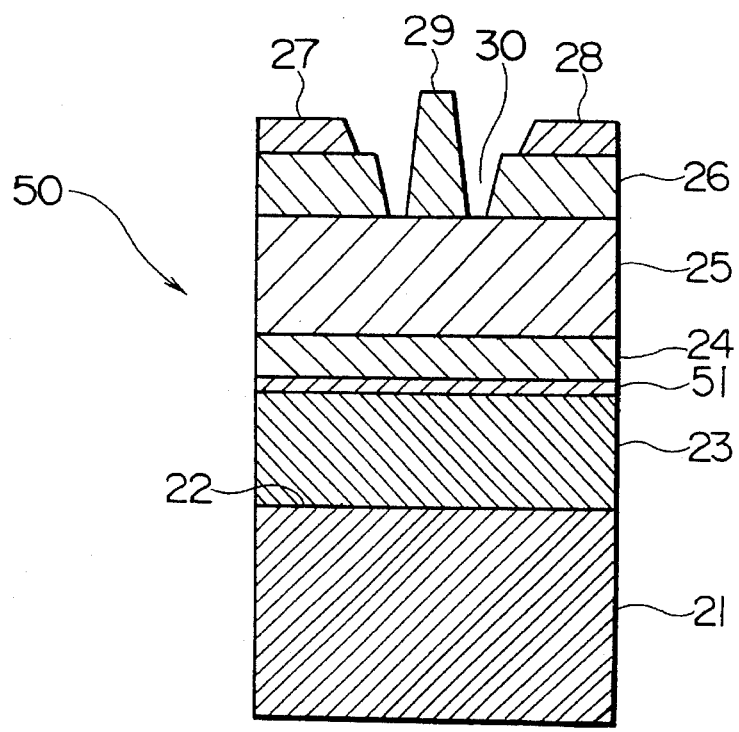
FIG. 4 shows a side view in section of a field effect transistor according to a third embodiment of this invention.

Referring to FIG. 4, description will proceed to a field effect transistor according to a third embodiment of this invention. The illustrated field effect transistor is different in structure from the field effect transistor 20 illustrated in FIG. 2 and is therefore designated afresh by a reference numeral 50. The field effect transistor 50 comprises similar parts which are designated by like reference numerals. In a similar manner as described in the first embodiment, the field effect transistor 50 is manufactured except that the field effect transistor 50 further comprises a fourth semiconductor layer 51 between the undoped layer 23 and the first semiconductor layer 24. The fourth semiconductor layer 51 has a thickness of 5 nanometers and is a doped layer which is composed of $In_{0.5}(Al_{0.3}Ga_{0.7})_{0.5}P$. The fourth semiconductor layer includes silicon as the n-type impure material which is uniformly doped at a density of $2\times10^{18}$ cm$^{-3}$ in the fourth semiconductor layer 51.

Now, description will be made as regards a transistor characteristic of each of the field effect transistors 10, 20, 40, and 50. A maximum transconductance, a cut-off frequency, and a maximum output current are measured in each of the field effect transistors 10, 20, 40, and 50. As a result of measurement of the maximum transconductance, the cut-off frequency, and the maximum output current, it is found that the field effect transistor 10 has the maximum transconductance of 300 mS/mm, the cut-off frequency of 29 GHz, and the maximum output current of 290 mA/mm. Similarly, it is found that the field effect transistor 20 has the maximum transconductance of 360 mS/mm, the cut-off frequency of 38 GHz, and the maximum output current of 330 mA/mm. It is found that the field effect transistor 40 has the maximum transconductance of 400 mS/mm, the cut-off frequency of 30 GHz, and the maximum output current of 480 mA/mm. It is found that the field effect transistor 50 has the maximum transconductance of 310 mS/mm, the cut-off frequency of 36 GHz, and the maximum output current of 410 mA/mm.

As readily understood from the above result of measurement, each of the field effect transistors 20, 40, and 50 has a transistor characteristic higher than that of the field effect transistor 10.

Although the gate electrode is composed of TiPtAu in each of the first through the third embodiments, the gate electrode may be composed of other materials by which Schottky junction is formed. Similarly, each of the ohmic electrodes may be composed of other materials although the each of the ohmic electrodes is composed of AuGeNi in each of the first through the third embodiments.

Although silicon is uniformly doped in the second semiconductor layer in each of the first through the third embodiments, silicon may be doped in the second semiconductor layer so as to change the density of silicon in a direction vertical to a layer surface of the second semiconductor layer. Namely, silicon may be step doped in the second semiconductor layer. Furthermore, silicon may be locally doped in the second semiconductor layer. For example, silicon may be planar doped in the second semiconductor layer. In addition, an undoped spacer layer may be formed between the first semiconductor layer and the second semiconductor layer. As far as the first semiconductor layer is composed of InGaAs, the composition ratio of InGaAs is not defined.

Although silicon is planar doped in the first semiconductor layer in the second embodiment, silicon may be uniformly or step doped in the first semiconductor layer.

Furthermore, a selected one of the sulfur and selenium is used as the impurity instead of silicon. In addition, the buffer layer may be composed of AlGaAs although the buffer layer is composed of GaAs in each of the first through the third embodiments. The buffer layer may have a superlattice structure composed of AlGaAs/GaAs.

What is claimed is:

1. A field effect transistor comprising a first semiconductor layer, a second semiconductor layer formed on said first semiconductor layer, and a heterojunction structure formed between said first semiconductor layer and said second semiconductor layer, wherein:

said first semiconductor layer being composed of InGaAs;

said second semiconductor layer being composed of InAlGaP, said first semiconductor layer comprising an undoped film; and a doped film in which a first impurity is doped; and said second semiconductor layer being further composed of a second impurity which is doped in said second semiconductor layer.

2. A field effect transistor comprising a semi-insulating substrate and a buffer layer formed on said semi-insulating substrate, a first semiconductor layer, said first semiconductor layer being formed on said buffer layer through an intermediate semiconductor layer, said first semiconductor layer being an undoped semiconductor layer; a second semiconductor layer formed on said first semiconductor layer, and a heterojunction structure formed between said first semiconductor layer and said second semiconductor layer, wherein:

said first semiconductor layer being composed of InGaAs; and said second semiconductor layer being composed of InAlGaP, said second semiconductor layer being further composed of an impurity which is doped in said second semiconductor layer.

3. A field effect transistor comprising a semi-insulating substrate and a buffer layer formed on said semi-insulating substrate, said semi-insulating substrate being composed of GaAs; and said buffer layer having a superlattice structure composed of AlGaAs/GaAs, a first undoped semiconductor layer formed on said buffer layer, said first undoped semiconductor layer being composed of InGaAs;

a second semiconductor layer formed on said first undoped semiconductor layer, and a heterojunction structure formed between said first undoped semiconductor layer and said second semiconductor layer; said second semiconductor layer being composed of InAlGaP, and said second semiconductor layer being further composed of an impurity which is doped in said second semiconductor layer.

4. A field effect transistor as claimed in claim 2, wherein said impurity is an n-type impurity.

5. A field effect transistor as claimed in claim 4, wherein:

said semi-insulating substrate is composed of GaAs; and said buffer layer being composed of a selected one of GaAs and AlGaAs.

6. A field effect transistor as claimed in claim 5, wherein said buffer layer is an undoped layer.

7. A field effect transistor as claimed in claim 6, wherein said intermediate semiconductor layer is composed of InAlGaP.

8. A field effect transistor as claimed in claim 7, wherein said intermediate semiconductor layer being further composed of an intermediate impurity which is doped in said intermediate semiconductor layer.

9. A field effect transistor as claimed in claim 8, wherein said intermediate impurity is an n-type impurity.

10. A field effect transistor as claimed in claim 9, wherein said intermediate impurity is one selected from the group consisting of silicon, sulfur, and selenium.

11. A field effect transistor as claimed in claim 4, wherein:

said semi-insulating substrate is composed of GaAs; and said buffer layer having a superlattice structure composed of AlGaAs/GaAs.

12. A field effect transistor as claimed in claim 11, wherein said buffer layer is an undoped layer.

13. A field effect transistor as claimed in claim 12, wherein said intermediate semiconductor layer is composed of InAlGaP.

14. A field effect transistor as claimed in claim 13, wherein said intermediate semiconductor layer being further composed of an intermediate impurity which is doped in said intermediate semiconductor layer.

15. A field effect transistor as claimed in claim 14, wherein said intermediate impurity is an n-type impurity.

16. A field effect transistor as claimed in claim 15, wherein said intermediate impurity is one selected from the group consisting of silicon, sulfur, and selenium.

17. A field effect transistor as claimed in claim 3, wherein said impurity is an n-type impurity.

18. A field effect transistor as claimed in claim 17, wherein said buffer layer is an undoped layer.

19. A field effect transistor as claimed in claim 18, said second semiconductor layer having a layer surface which is divided into a predetermined part and a remaining part, wherein said field effect transistor further comprises:

a third semiconductor layer formed on said predetermined part;

ohmic electrodes formed on said third semiconductor layer; and a gate electrode formed on said remaining part.

20. A field effect transistor as claimed in claim 19, wherein said third semiconductor layer is composed of GaAs and an additional impurity of an n-type.

21. A field effect transistor as claimed in claim 20, said additional impurity is one selected from the group consisting of silicon, sulfur, and selenium.

22. A field effect transistor as claimed in claim 21, wherein said gate electrode is Schottky gate electrode.

23. A field effect transistor as claimed in claim 1, wherein each of said first and said second impurities is an n-type impurity.

24. A field effect transistor as claimed in claim 23, wherein each of said first and said second impurities is one selected from the group consisting of silicon, sulfur, and selenium.

25. A field effect transistor as claimed in either claim 4 or claim 17, wherein said impurity is one selected from the group consisting of silicon, sulfur, and selenium.

* * * * *